(12) United States Patent
Kimura

(10) Patent No.: US 12,356,734 B2
(45) Date of Patent: Jul. 8, 2025

(54) METHOD OF MANUFACTURING PHOTODETECTION DEVICE

(71) Applicant: SUMITOMO ELECTRIC INDUSTRIES, LTD., Osaka (JP)

(72) Inventor: Ren Kimura, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 446 days.

(21) Appl. No.: 18/074,288

(22) Filed: Dec. 2, 2022

(65) Prior Publication Data

US 2023/0207604 A1 Jun. 29, 2023

(30) Foreign Application Priority Data

Dec. 24, 2021 (JP) ................. 2021-210430

(51) Int. Cl.
*H10F 39/00* (2025.01)
(52) U.S. Cl.
CPC ......... *H10F 39/018* (2025.01); *H10F 39/809* (2025.01); *H10F 39/811* (2025.01)

(58) Field of Classification Search
None
See application file for complete search history.

(56) References Cited

U.S. PATENT DOCUMENTS

2018/0286900 A1* 10/2018 Chen ............... H10F 39/199

FOREIGN PATENT DOCUMENTS

| EP | 2161973 A1 * | 3/2010 | ........... H05K 1/0219 |
| JP | 2015-12228 A | 1/2015 | |

* cited by examiner

*Primary Examiner* — Sue A Purvis
*Assistant Examiner* — Carnell Hunter, III
(74) *Attorney, Agent, or Firm* — Volpe Koenig

(57) ABSTRACT

A method of manufacturing a photodetection device includes preparing a first substrate having a first electrode; forming, on the first substrate, a photoresist film having an opening through which the first electrode is exposed; forming, through the opening, a metallic film containing a first metal on the first electrode; and removing, after the forming of the metallic film, the photoresist film. The forming of the metallic film includes vapor-depositing the metallic film on the first electrode and on the photoresist film, and heating the metallic film formed on the photoresist film.

10 Claims, 19 Drawing Sheets

METHOD OF MANUFACTURING PHOTODETECTION DEVICE

CROSS-REFERENCE TO RELATED APPLICATIONS

This application claims priority based on Japanese Patent Application No. 2021-210430 filed on Dec. 24, 2021, and the entire contents of the Japanese patent application are incorporated herein by reference.

FIELD OF THE INVENTION

The present disclosure relates to a method of manufacturing a photodetection device.

BACKGROUND ART

As a photodetection device for detecting infrared light, a photodetection device in which a light-receiving element and a signal processing substrate are connected by an indium hump (In-bump) has been disclosed (see, for example, Japanese Unexamined Patent Application Publication No. 2015-012228). The In-bump is formed by forming, on a light-receiving element or a signal processing substrate, a photoresist film having an opening through which an electrode is exposed and subsequently vapor-depositing indium.

SUMMARY OF THE INVENTION

A method of manufacturing a photodetection device according to an aspect of the present disclosure includes preparing a first substrate having a first electrode; forming, on the first substrate, a photoresist film having an opening through which the first electrode is expose; forming, through the opening, a metallic film containing a first metal on the first electrode; and removing, after the forming of the metallic film, the photoresist film. The forming of the metallic film includes vapor-depositing the metallic film on the first electrode and on the photoresist and heating the metallic film formed on the photoresist film.

DETAILED DESCRIPTION

Figure 1:
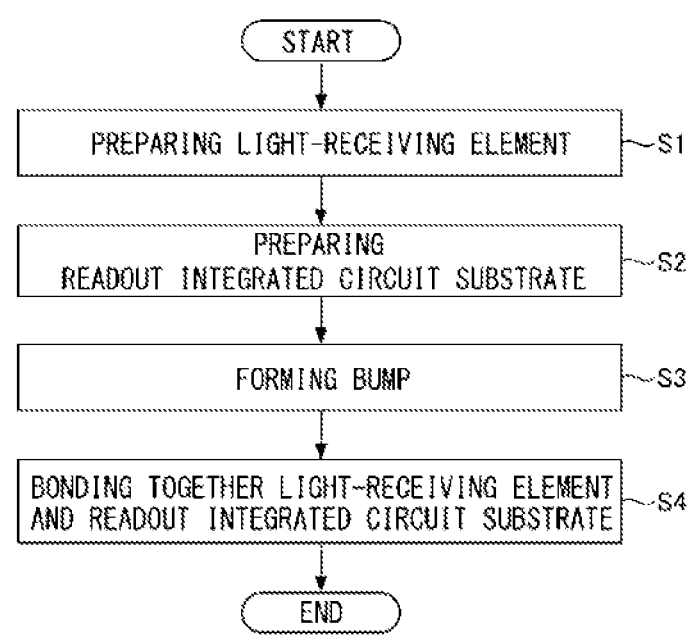
FIG. 1 is a diagram illustrating a method of manufacturing a photodetection device according to an embodiment of the present disclosure.

In a conventional manufacturing method, when indium is vapor-deposited, indium is deposited on a photoresist film so as to protrude from an edge of an opening. For this reason, when a thickness (height) of indium is increased, a space over the opening is blocked during vapor deposition, and a bump having a desired height may not be formed.

An object of the present disclosure is to provide a method of manufacturing a photodetection device that enables formation of a bump having a desired height.

Embodiments according to the present disclosure will be described below.

DESCRIPTION OF EMBODIMENTS OF THE PRESENT DISCLOSURE

First, embodiments of the present disclosure will be listed and described. In the following description, like or corresponding elements are denoted by like reference numerals, and redundant descriptions thereof will be omitted.

(1) A method of manufacturing a photodetection device according to an aspect of the present disclosure includes preparing a first substrate having a first electrode; forming, on the first substrate, a photoresist film having an opening through which the first electrode is exposed; forming, through the opening, a metallic film containing a first metal on the first electrode; and removing, after the forming of the metallic film, the photoresist film. The forming of the metallic film includes vapor-depositing the metallic film on the first electrode and on the photoresist film, and heating the metallic film formed on the photoresist film.

During the vapor deposition of the metallic film on the first electrode and the photoresist film, the metallic film deposited on the photoresist film and the metallic film deposited on the first electrode are heated to turn the metallic film into droplets. Therefore, the metallic film on the protruding from an edge of the opening of the Photoresist film is pulled back onto photoresist film due to surface tension. As a result, an opening width of a space over the opening increases. Therefore, since the metallic film can be further vapor-deposited in a state in which the opening width of the opening is widened, the metallic film having a desired thickness can be formed on the first electrode. As a result, when the photoresist film is removed, a bump having a desired height is formed.

(2) In the method described in (1), the heating of the metallic film may include heating the metallic film at a melting point of the first metal or higher. In this case, the metallic film can be easily turned into a droplet.

(3) In the method described in (1) or (2), the heating of the metallic film may include cooling the first substrate. In this case, since the photoresist film is prevented from becoming too hot, the photoresist film is prevented from burning.

(4) In the method described in (1) to (3), the heating of the metallic film may include heating with the first substrate placed such that a surface including the photoresist film faces downward. In this case, since the droplet of the metallic film on the first electrode is uniformly spread over the entire surface of the first electrode due to surface tension, a positional deviation of the metallic film relative to the first electrode can be reduced. In addition, part of the droplet of the first metal drops downward due to gravity. This allows a variation in thickness that may occur among a plurality of metallic films to be reduced.

(5) In the method described in (4), the vapor-depositing of the metallic film may include, with the first substrate placed such that the surface including the photoresist film faces downward, heating the first metal placed in a container disposed below the first substrate. The heating of the metallic film may include heating performed above the container. In this case, even when part of the droplet of the first metal drops, the first metal can be recovered in the container. This allows the first metal to be reused.

(6) in the method described in (5), in plan view, an outer periphery of the first substrate may be positioned inside relative to an outer periphery of the container. In this case, the first metal can be prevented from dropping to the outside of the container. This allows the first metal to be efficiently recovered.

(7) In the method described in (1) to (6), the vapor-depositing of the metallic film and the heating of the metallic film may be repeated. In this case, it is easy to form a thick metallic film on the first electrode.

(8) In the method described in (1) to (7), the first metal may be indium. In his case, it is easier to connect the metallic film to the first electrode.

(9) In the method described in (1) to (8), the method may further include preparing a second substrate having a second electrode, and placing a first main surface having the first electrode of the first substrate and a second main surface having the second electrode of the second substrate so as to face each other and bonding together the metallic film and the second electrode. In this case, the first substrate and the second substrate can be bonded together without providing a bump on the second electrode.

(10) In the method described in (9), the first substrate may be a circuit substrate, and the second substrate may be a light-receiving element. In this case, the circuit substrate and the light-receiving element can be bonded together without providing a bump on the light-receiving element.

Details of Embodiments of the Present Disclosure

Hereinafter, an embodiment according to the present disclosure will be described in detail, but embodiments of the present disclosure are not limited thereto.

Method of Manufacturing Photodetection Device

A method of manufacturing a photodetection device according to an embodiment will be described with reference to FIG. 1. FIG. 1 is a diagram illustrating a method of manufacturing a photodetection device according to the embodiment.

In the embodiment, first, a light-receiving element having a main surface on which a plurality of electrodes are arranged is prepared (S1). In addition, a readout integrated circuit (ROIC) substrate having a main surface on which a plurality of electrodes are arranged is prepared (S2). Next, a bump containing indium (In) is formed on each of the plurality of electrodes of the readout integrated circuit substrate (S3). Next, the main surface of the light-receiving element and the main surface of the readout integrated circuit substrate are made to face each other, and the electrodes of the light-receiving element and the bumps are overlapped with each other. Next, the electrodes of the light-receiving element and the electrodes of the readout integrated circuit substrate are bonded together via the bumps by reflow in a reducing atmosphere (S4).

(Method S1 of Preparing Light-Receiving Element)

Figure 2:
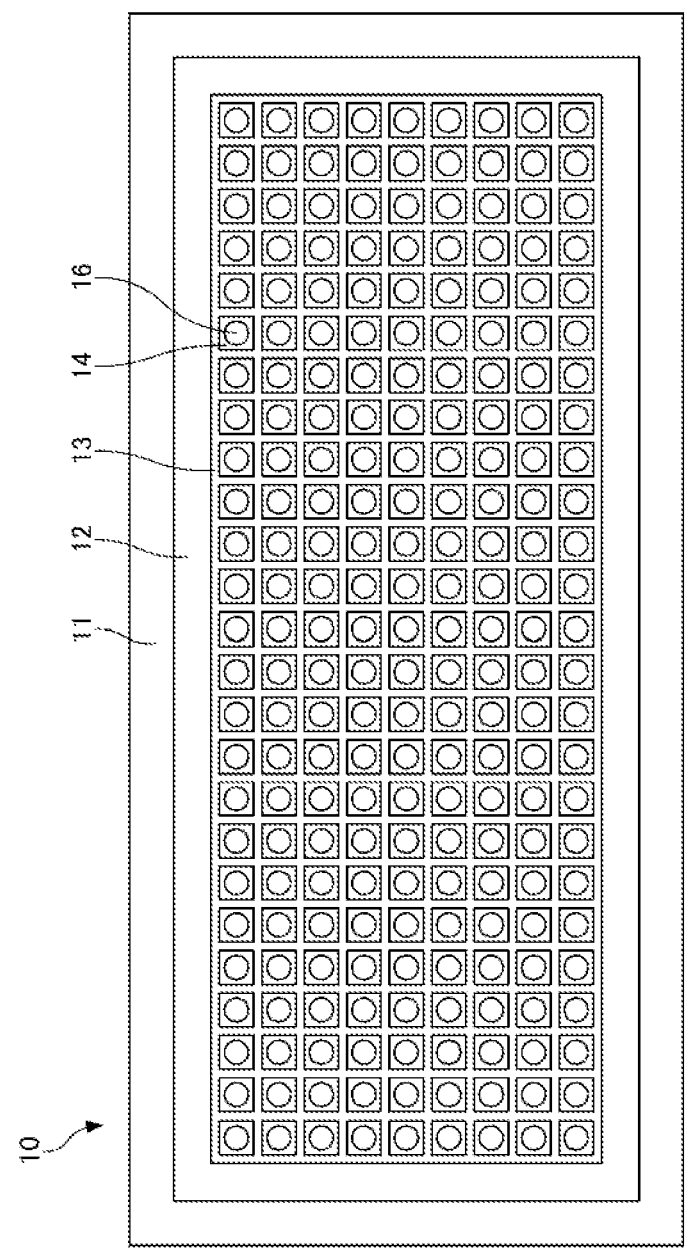
FIG. 2 is a plan view illustrating a method of preparing a light-receiving element according to an embodiment of the present disclosure.
Figure 3:
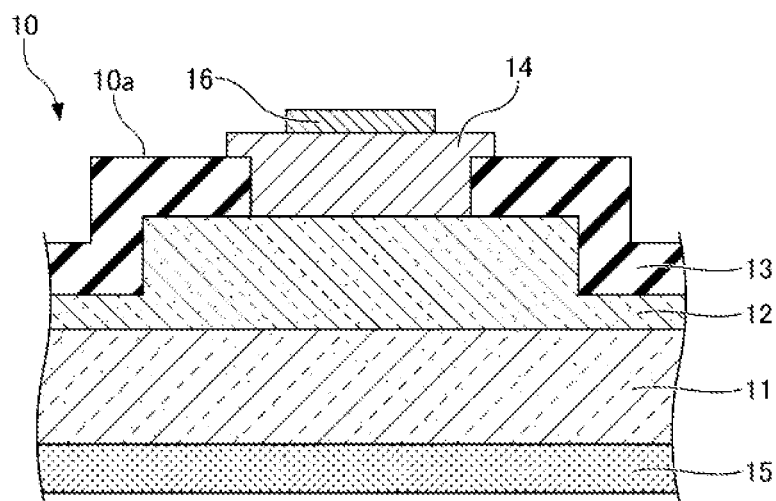
FIG. 3 is a cross-sectional view illustrating a method for preparing a light-receiving element according to an embodiment of the present disclosure.

Referring to FIGS. 2 and 3, a method of preparing a light-receiving element (first substrate) will be described. FIGS. 2 and 3 are views illustrating a method of preparing a light-receiving element in the embodiment. FIG. 2 is a plan view illustrating a plurality of electrodes formed on the light-receiving element, and FIG. 3 is a cross-sectional view including one electrode of the plurality of electrodes in FIG. 2.

First, as shown in FIG. 2, a light-receiving element 10 is prepared. Light-receiving element 10 has a main surface 10a (second main surface) on which, for example, a plurality of p-electrodes 14 (second electrodes) are arranged at a predetermined pitch. The predetermined pitch is, for example, 90 μm. As shown in FIG. 3, in a cross-sectional view including one p-electrode 14, light-receiving element 10 includes a substrate 11, an epitaxial layer 12, a passivation film 13, p-electrode 14, an antireflection film 15, and a metallic layered film 16. Light-receiving element 10 further includes an n-electrode, a wiring electrode (both not shown), and the like.

Substrate 11 is a semi-insulating InP (indium phosphide) substrate doped with Fe (iron) as an impurity. Substrate 11 has a thickness of, for example, 560 μm to 690 μm, and preferably 625 μm.

Epitaxial layer 12 is provided on one main surface 11a of substrate 11. Epitaxial layer 12 has a thickness of, for example, 6.3 μm to 7.7 μm, and preferably 7 μm.

Passivation film 13 is provided on epitaxial layer 12. Passivation film 13 has an opening through which a surface of a contact layer of epitaxial layer 12 is exposed. Passivation film 13 has a thickness of, for example, 0.18 μm to 0.22 μm, and preferably 0.2 μm.

P-electrode 14 is provided on the contact layer of epitaxial layer 12. P-electrode 14 is, for example, a laminated film of a Ti (titanium) layer and a Pt (platinum) layer. The Ti layer has a thickness of, for example, 0.045 μm to 0.055 μm, and preferably 0.05 μm. The Pt layer has a thickness of, for example, 0.072 μm to 0.088 μm, and preferably 0.08 μm.

Antireflection film 15 is provided on the other main surface of substrate 11. Antireflection film 15 is, for example, a SiN film. Antireflection film 15 has a thickness of, for example, 0.135 μm to 0.165 μm, and preferably 0.15 μm.

Metallic layered film 16 is provided on p-electrode 14. Metallic layered film 16 is an under bump metal (UBM). Metallic layered film 16 is, for example, a laminated film of a Ti layer, a Ni (nickel) layer, and an Au (gold) layer. The Ti layer has a thickness of, for example, 0.045 μm to 0.055 μm, and preferably 0.05 μm. The Ni layer has a thickness of, for example, 0.09 μm to 0.11 μm, and preferably 0.1 μm. The Au layer has a thickness of, for example, 0.027 μm to 0.033 μm, and preferably 0.03 μm.

(Method S2 of Preparing Readout Integrated Circuit Substrate)

Figure 4:
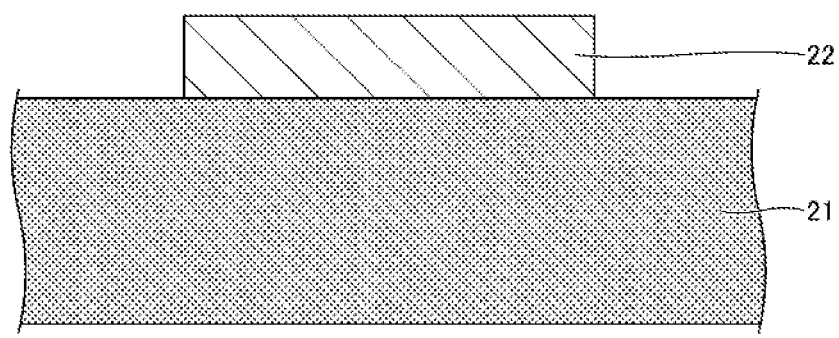
FIG. 4 is a cross-sectional view illustrating a method of preparing a readout integrated circuit substrate according to an embodiment of the present disclosure.

Referring to FIG. 4, a method of preparing a readout integrated circuit substrate will be described. FIG. 4 is a cross-sectional view illustrating a method of preparing a readout integrated circuit substrate in the present embodiment.

As shown in FIG. 4, a readout integrated circuit substrate 20 includes a wiring substrate 21, a plurality of pixel electrodes 22 (first electrodes), and a common electrode (not shown). The plurality of pixel electrodes 22 and the common electrode are arranged on one surface of wiring substrate 21. Pixel electrodes 22 are to be connected to respective p-electrodes 14, and the common electrode is to be connected to the wiring electrode. Readout integrated circuit substrate 20 has a main surface 20a (first main surface) on a side where pixel electrodes 22 and the common electrode are provided when viewed from wiring substrate 21. Pixel electrodes 22 and the common electrode are arranged on main surface 20a. Readout integrated circuit substrate 20 is an example of a circuit substrate (first substrate).

(Method S3 of Forming Bump)

A method of forming a bump will be described with reference to FIGS. 5 to 13. FIGS. 5 to 13 are cross-sectional views illustrating a method of forming a bump in the embodiment.

Figure 5:
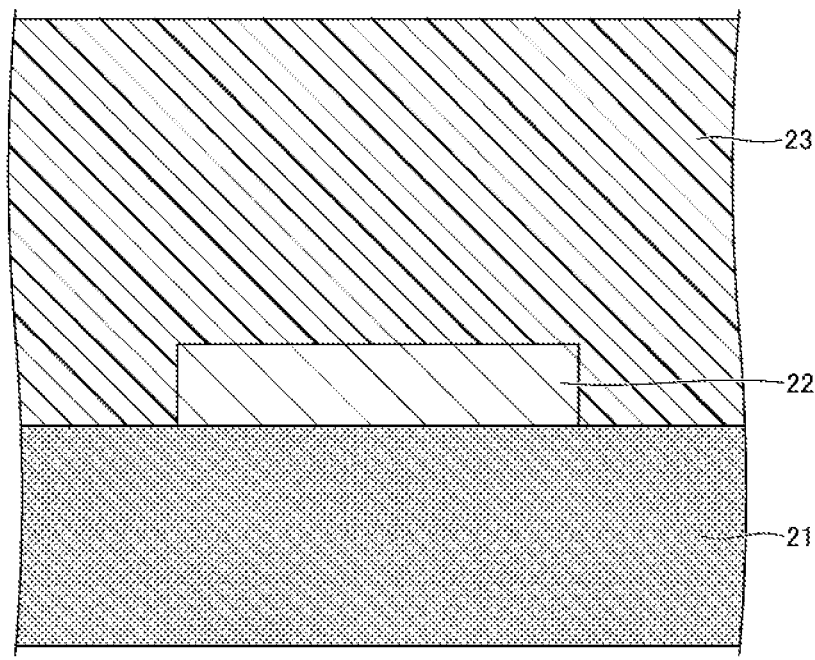
FIG. 5 is a cross-sectional view (part 1) illustrating a method of forming a bump according to an embodiment of the present disclosure.

First, as shown in FIG. 5, a photoresist film 23 is formed on wiring substrate 21 and each of pixel electrodes 22 by coating.

Figure 6:
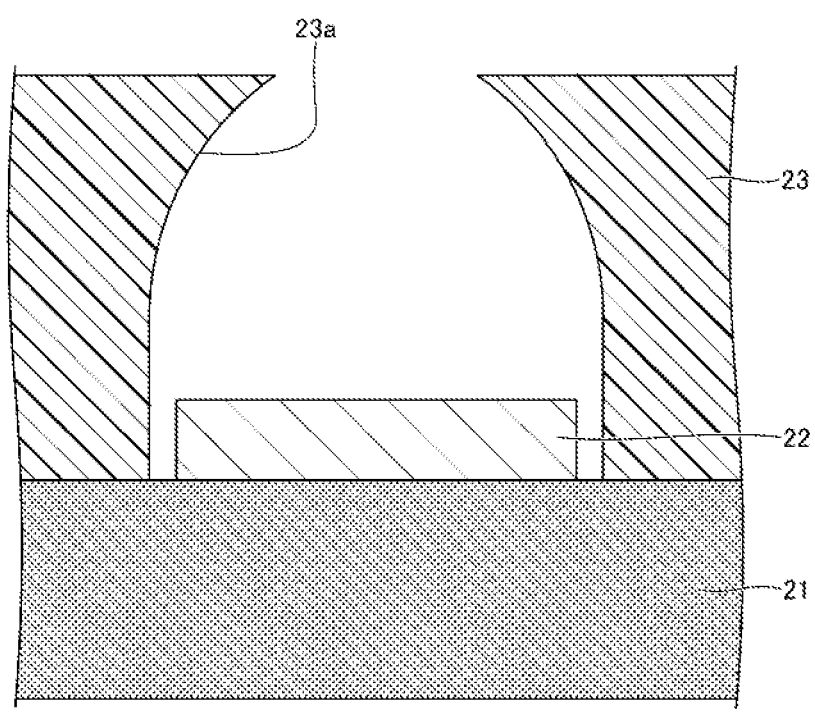
FIG. 6 is a cross-sectional view (part 2) illustrating a method of forming a bump according to an embodiment of the present disclosure.

Next, as shown in FIG. 6, photoresist film 23 is exposed and developed to form, in photoresist film 23, an opening 23a through which each of pixel electrodes 22 is exposed.

Figure 7:
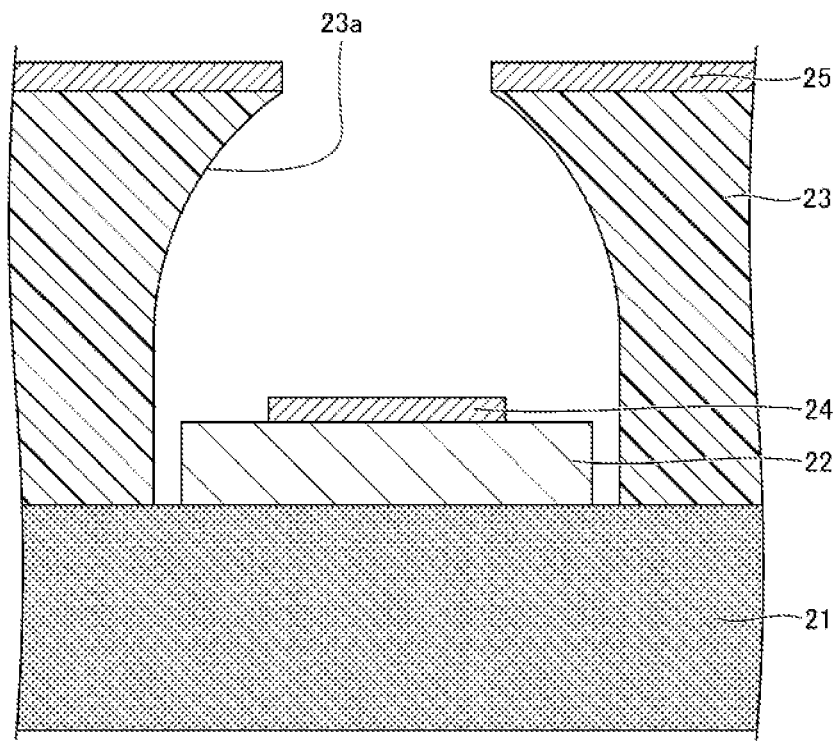
FIG. 7 is a cross-sectional view (part 3) illustrating a method of forming a bump according to an embodiment of the present disclosure.

Next, as shown in FIG. 7, a metal constituting the under bump metal is vapor-deposited. That is, electron beam (EB) deposition of Ti, Ni, and Au is performed. As a result, a metallic layered film 24 is formed on each of pixel electrodes 22 inside opening 23a, and a metallic layered film 25 is formed on photoresist film 23.

Figure 8:
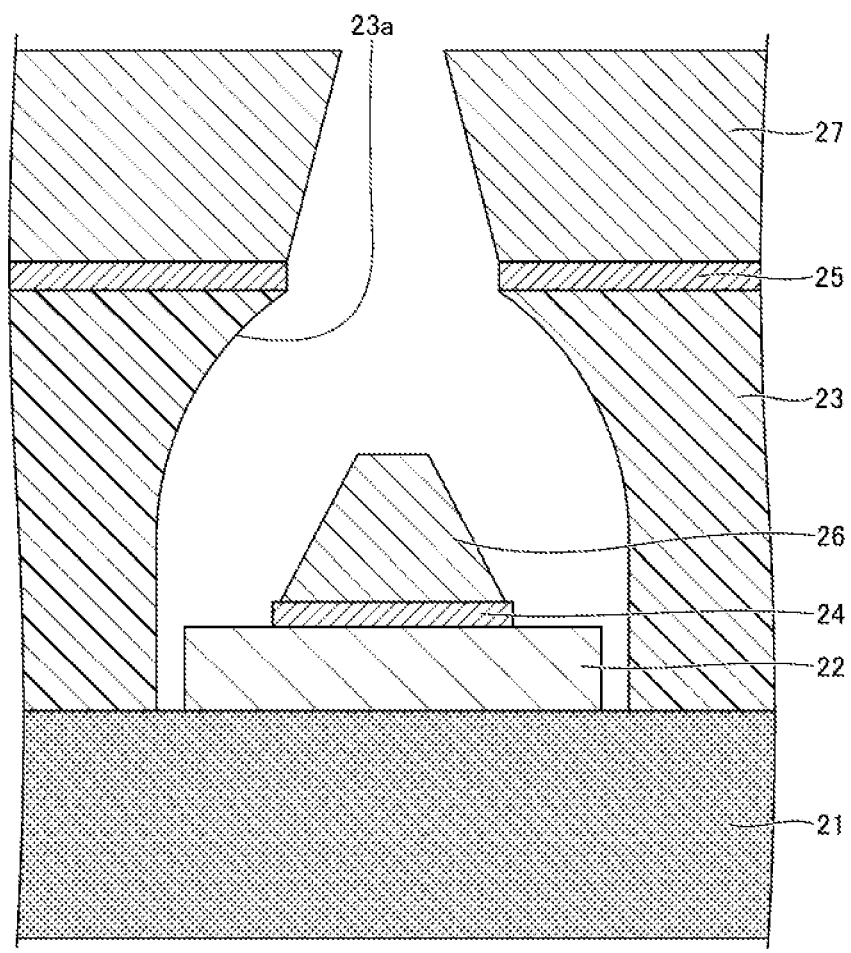
FIG. 8 is a cross-sectional view (part 4) illustrating a method of forming a bump according to an embodiment of the present disclosure.
Figure 9:
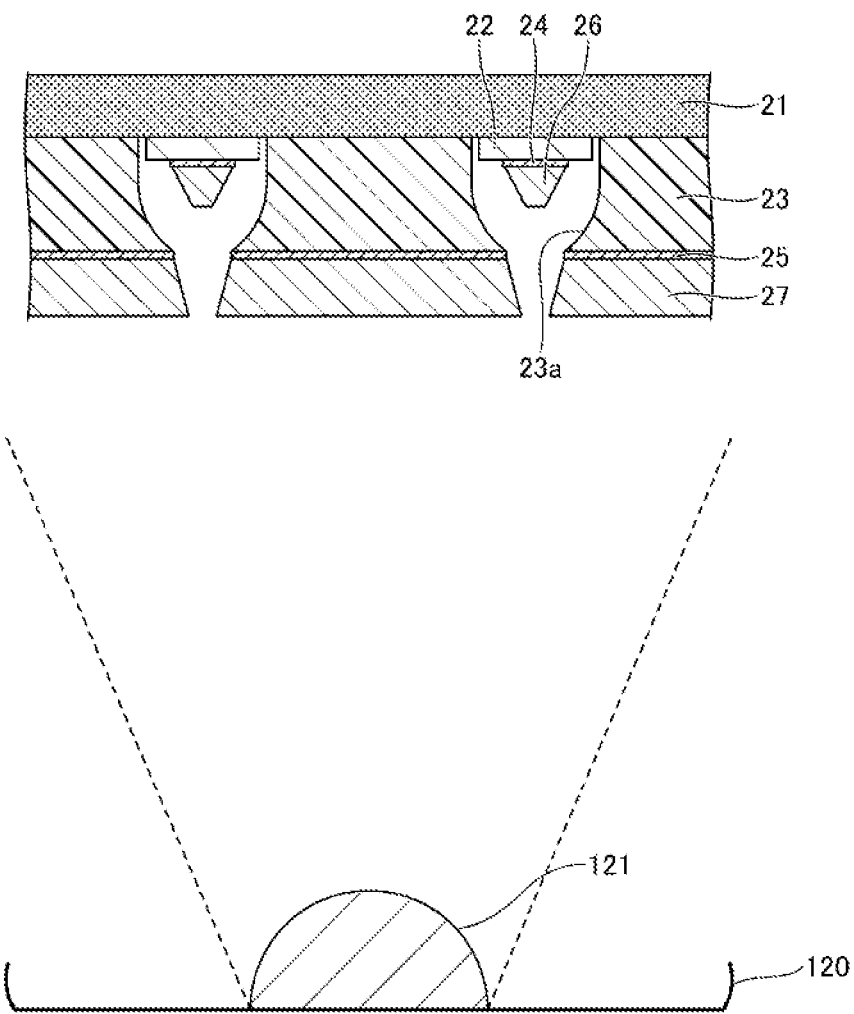
FIG. 9 is a cross-sectional view (part 5) illustrating a method of forming a bump according to an embodiment of the present disclosure.

Next, as shown in FIG. 8, indium (first metal) is vapor-deposited by resistance heating deposition with photoresist film 23 left. As a result, an In-film 26 (metallic film) is formed on metallic layered film 24 inside opening 23a, and In-film 27 (metallic film) is thrilled on metallic layered film 25 provided on photoresist film 23. At this time, In-film 27 is deposited on metallic layered film 25 provided on photoresist film 23 so as to protrude from an edge of opening 23a. Therefore, the vapor deposition of indium is temporarily stopped before a space over opening 23a is blocked. As shown in FIG. 9, preferably, a film-forming source material 121 placed in a resistance-heating boat 120 disposed below wiring substrate 21 is evaporated to vapor-deposit indium with wiring substrate 21 placed such that the surface including the photoresist film fixes downward. In this case, it is possible to prevent particles from adhering onto metallic layered film 24 and metallic layered film 25. Indium may be vapor-deposited by EB deposition.

Figure 10:
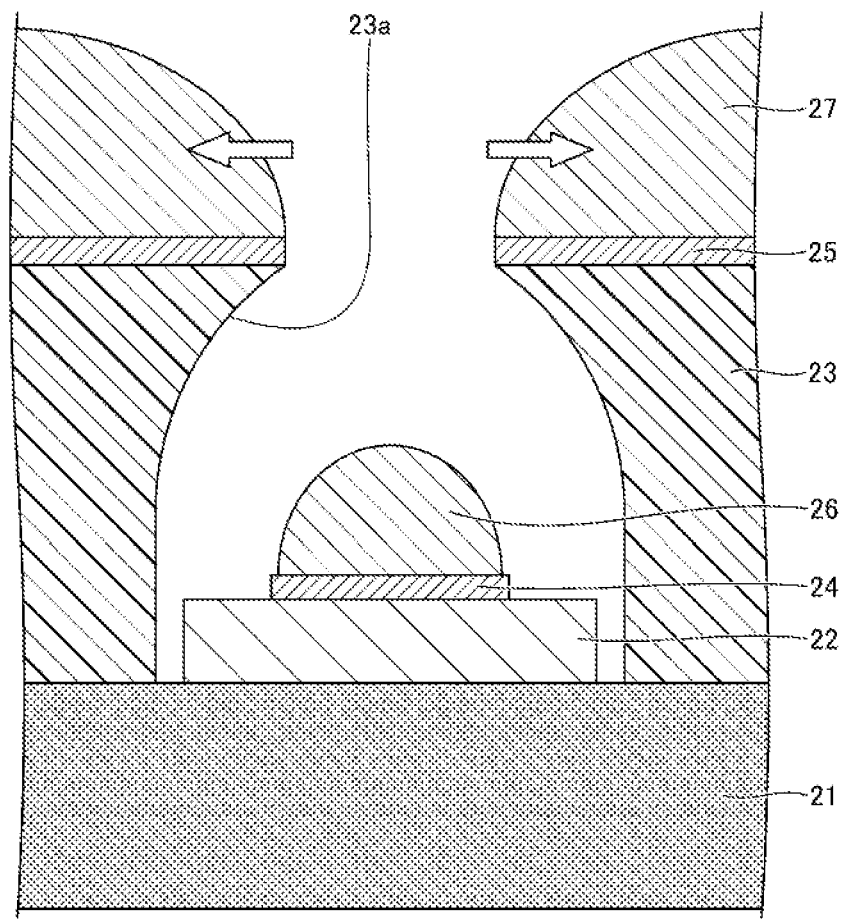
FIG. 10 is a cross-sectional view (part 6) illustrating a method of forming a bump according to an embodiment of the present disclosure.

Next, as shown in FIG. 10, the resistance-heating vapor deposition of indium is temporarily stopped, and In-film 26 formed on metallic layered film 24 and In-film 27 formed on metallic layered film 25 are heated to a predetermined temperature or higher. As a result, In-film 26 and In-film 27 are turned into droplets, so that In-film 27 protruding from the edge of opening 23a is pulled back onto metallic layered film 25 due to surface tension. This allows an opening width of the space over opening 23a to be increased. The predetermined temperature may be a temperature at which at least part of In-film 26 and In-film 27 is turned into droplets, and is preferably a melting point of indium. In-film 26 and In-film 27 are easily turned into droplets by heating In-film 26 and In-film 27 at the melting point of indium or higher.

Figure 11:
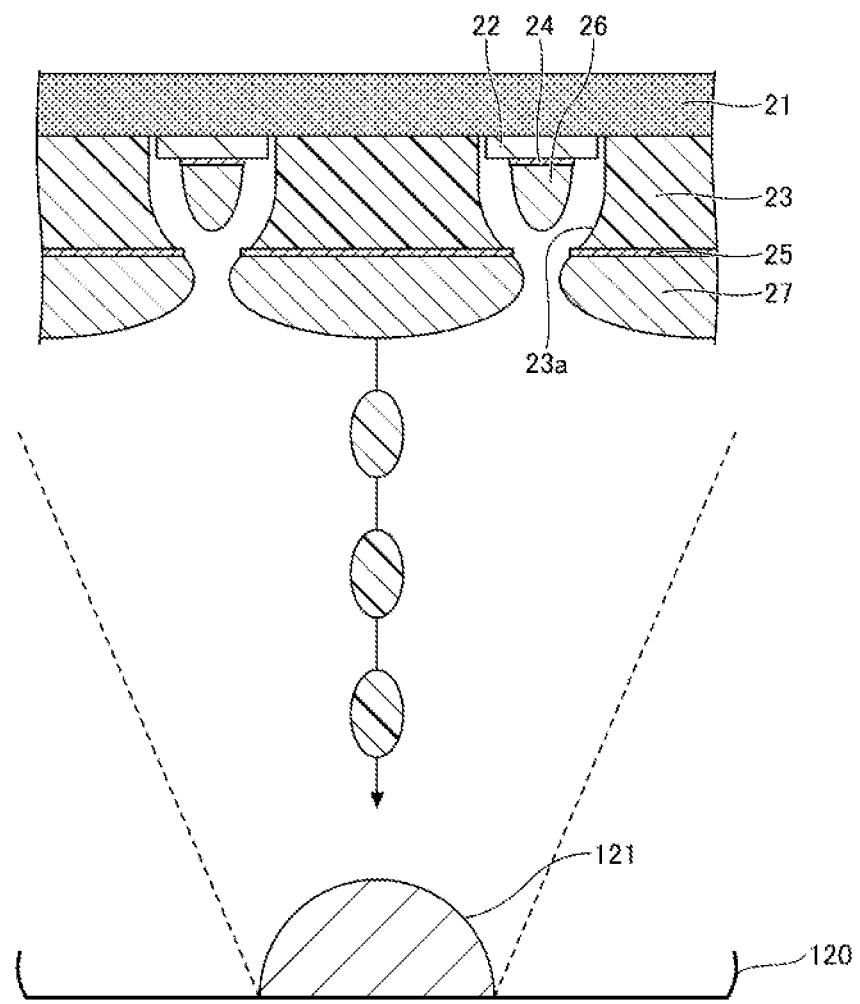
FIG. 11 is a cross-sectional view (part 7) illustrating a method of forming a bump according to an embodiment of the present disclosure.

As shown in FIG. 11, the heating of In-film 26 and In-film 27 is preferably performed with wiring substrate 21 placed such that the surface including photoresist film 23 faces downward. This allows a droplet of In-film 26 to uniformly spread over the entire surface of metallic layered film 24 due to surface tension, thereby reducing a positional deviation of In-film 26 relative to metallic layered films 24. In addition, part of the droplet of In-film 26 drops downward due to gravity. This can reduce a variation in thickness that may occur among a plurality of In-films 26.

The heating of In-film 26 and In-film 27 is preferably performed above resistance-heating boat 120 disposed below wiring substrate 21 as shown in FIG. 11. As a result, even when part of the indium droplets drops, the dropped indium is recovered in resistance-heating boat 120. This allows indium to be reused. In plan view, the outer periphery of wiring substrate 21 may be positioned inside relative to the outer periphery of resistance-heating boat 120. In this case, indium can be prevented from dropping to the outside of resistance-heating boat 120. This allows indium to be efficiently recovered. The heating of In-film 27 is preferably performed with wiring substrate 21 cooled. In this case, photoresist film 23 is prevented from becoming too hot, so that photoresist film 23 can be prevented from burning.

Figure 12:
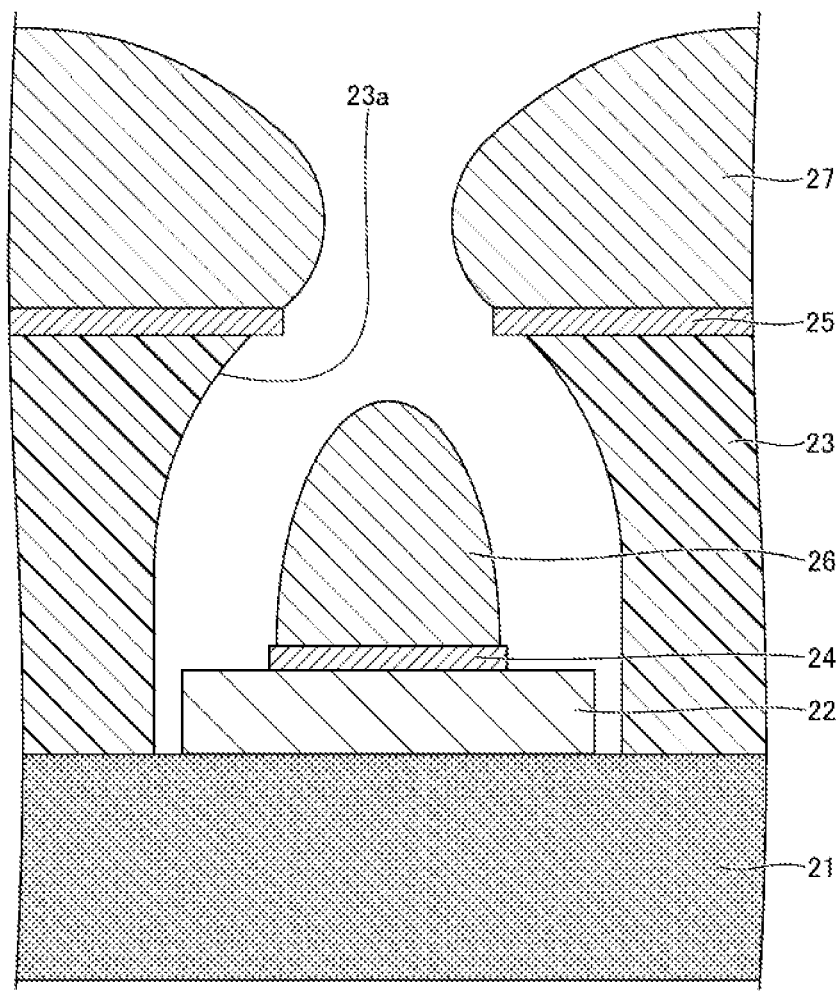
FIG. 12 is a cross-sectional view (part 8) illustrating a method of forming a bump according to an embodiment of the present disclosure.

The resistance-heating vapor deposition of indium is then resumed, as shown in FIG. 12. As a result, In-film 26 is vapor-deposited on metallic layered film 24 inside opening 23a to have an increased thickness. Further, In-film 27 is formed on metallic layered film 25 provided on photoresist film 23. At this time, since opening 23a is widened by the heating of In-film 27, the space over opening 23a is difficult to be blocked. After In-film 26 having a desired thickness is formed on metallic layered films 24, the vapor deposition of indium by resistive heating is stopped. In a case where In-film 26 having a desired thickness is not formed on metallic layered film 24 before the space over opening 23a is blocked, it is preferable to repeatedly perform the heating of indium and the resistance-heating vapor deposition of indium. By repeating the heating of indium and the resistance-heating vapor deposition of indium, it is easy to form In-film 26 having a large thickness. A vapor deposition apparatus for forming In-film 26 having a desired thickness will be described later.

Figure 13:
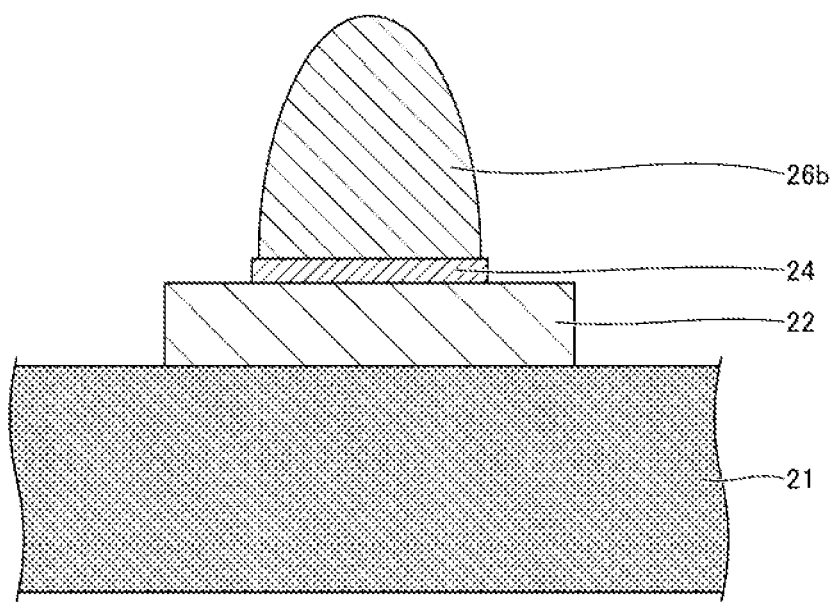
FIG. 13 is a cross-sectional view (part 9) illustrating a method of forming a bump according to an embodiment of the present disclosure.

Next, as shown in FIG. 13, photoresist film 23 is removed. As photoresist film 23 is removed, metallic layered film 25 and In-film 27 are also removed. An In-bump 26b is formed by remaining In-films 26. As described above, In-bump 26b is thrilled by a lift-off method.

(Method S4 of Bonding Together Light-Receiving Element and Readout Integrated Circuit Substrate)

Figure 14:
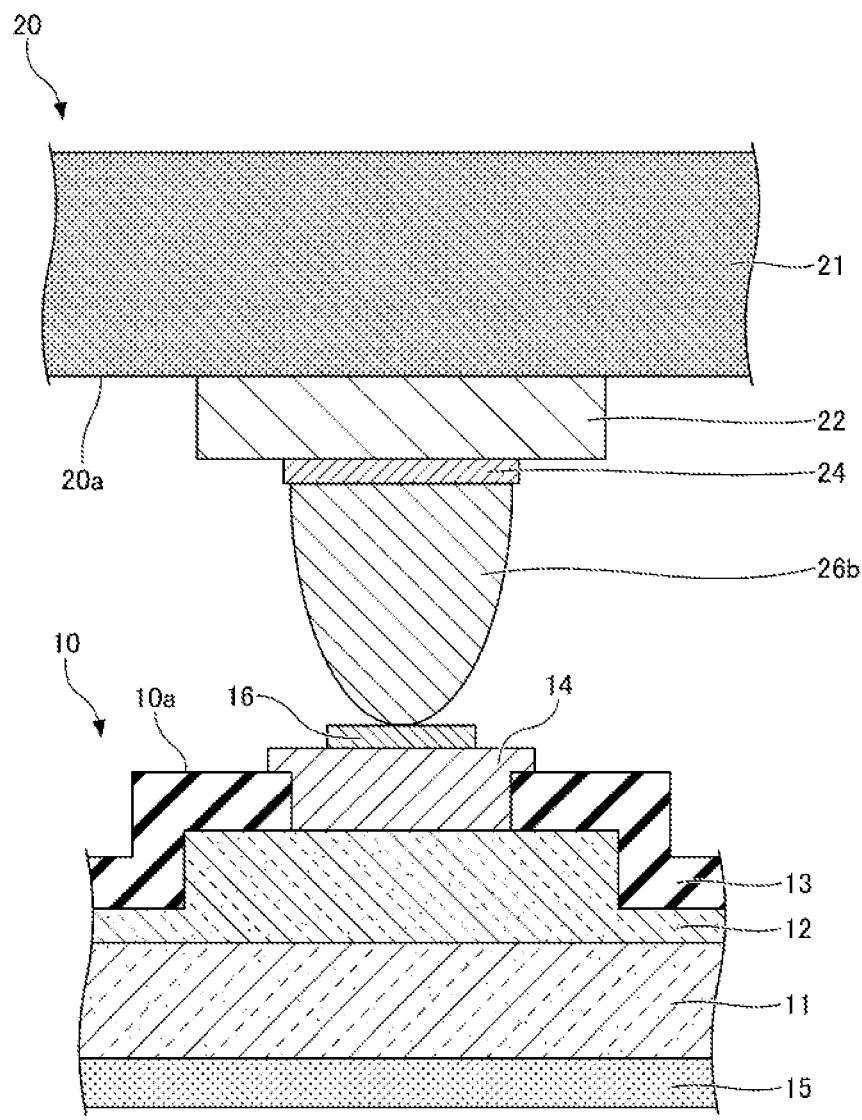
FIG. 14 is a cross-sectional view (part 1) illustrating a method of bonding together a light-receiving element and a readout integrated circuit substrate according to an embodiment of the present disclosure.
Figure 15:
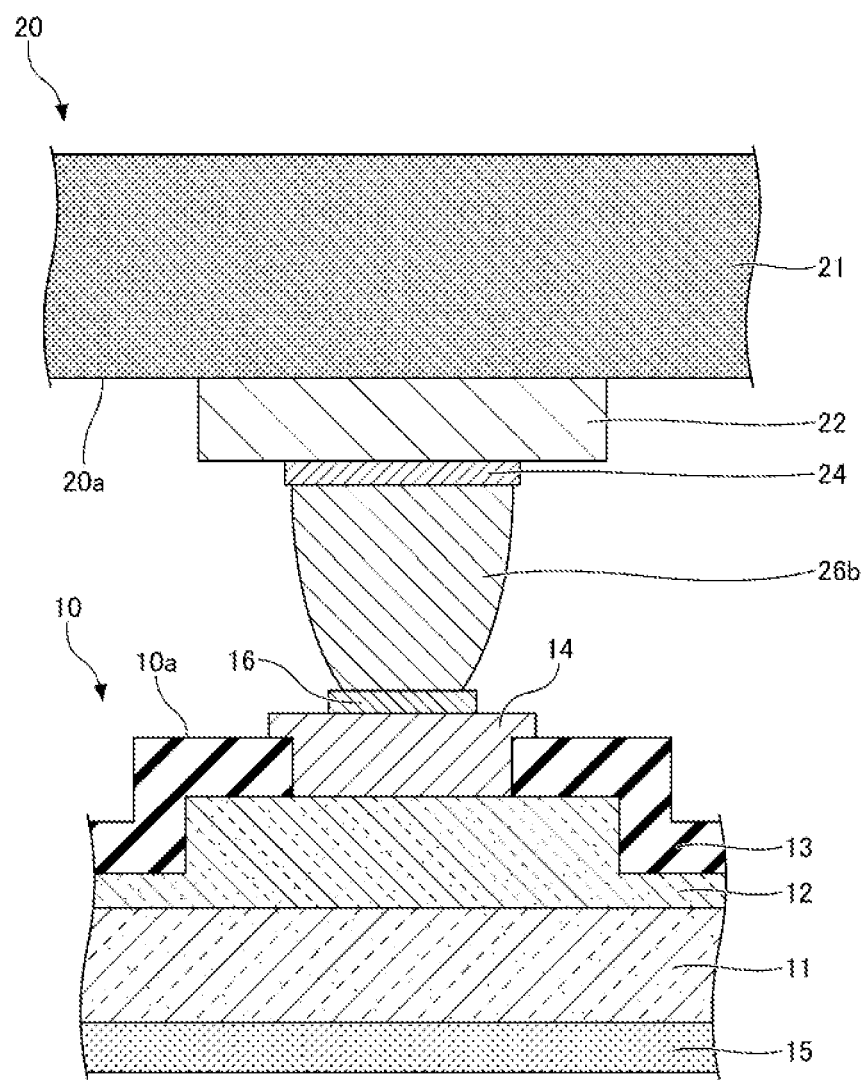
FIG. 15 is a cross-sectional view (part 2) illustrating a method of bonding together a light-receiving element and a readout integrated circuit substrate according to an embodiment of the present disclosure.
Figure 16:
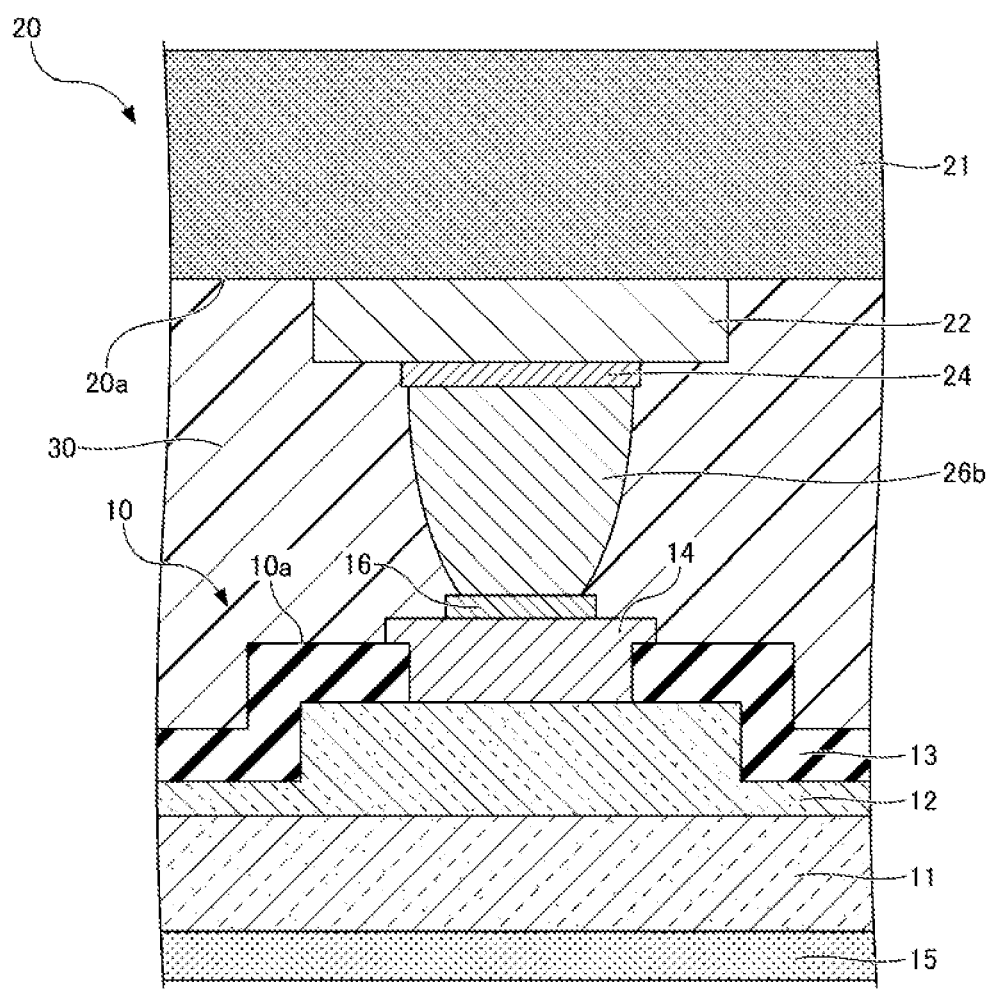
FIG. 16 is a cross-sectional view (part 3) illustrating a method of bonding together a light-receiving element and a readout integrated circuit substrate according to an embodiment of the present disclosure.

A method of bonding together light-receiving element 10 and readout integrated circuit substrate 20 will be described with reference to FIGS. 14 to 16. FIGS. 14 to 16 are cross-sectional views illustrating a method of bonding together a light-receiving element and a readout integrated circuit substrate in the embodiment.

First, as shown in FIG. 14, readout integrated circuit substrate 20 is placed on light-receiving element 10. At this time, main surface 10a of light-receiving element 10 and main surface 20a of readout integrated circuit substrate 20 are placed so as to face each other, and metallic layered film 16 and In-bump 26b is overlapped. In addition to placing readout integrated circuit substrate 20 on light-receiving element 10, light-receiving element 10 and readout integrated circuit substrate 20 may be temporarily bonded together with a slight pressure applied.

Next, reflow is performed in a reducing atmosphere containing formic acid. As a result, as shown in FIG. 15, metallic layered film 16 and In-bump 26b are bonded together. During the reflow, In-bump 26b is melted, so that self-alignment is performed. The reflow in a reducing atmosphere containing formic acid is also performed in reflow of solder or the like, and the atmosphere is easily controlled.

Next, as shown in FIG. 16, a space interposed between main surface 10a and main surface 20a is filled with a sealing resin 30.

In this manner, photodetection device 1 may be manufactured. Photodetection device 1 detects infrared light that is incident on the other main surface of substrate 11 through antireflection film 15.

In the present embodiment, while In-film 26 is vapor-deposited on metallic layered film 24, In-film 27 deposited on metallic layered film 25 is heated to turn In-film 27 into droplets. Therefore, In-film 27 protruding from the edge of opening 23a is pulled back onto metallic layered film 25 due to surface tension. This increases the opening width of the space over opening 23a. As a result, In-films 26 can be further vapor-deposited with the opening width of opening 23a widened, so that In-film 26 having a desired thickness can be formed on metallic layered film 24.

(Vapor Deposition Apparatus)

In the method of manufacturing photodetection device 1 according to the embodiment, a vapor deposition apparatus for forming In-film 26 having a desired thickness on metallic layered film 24 will be described.

Figure 17:
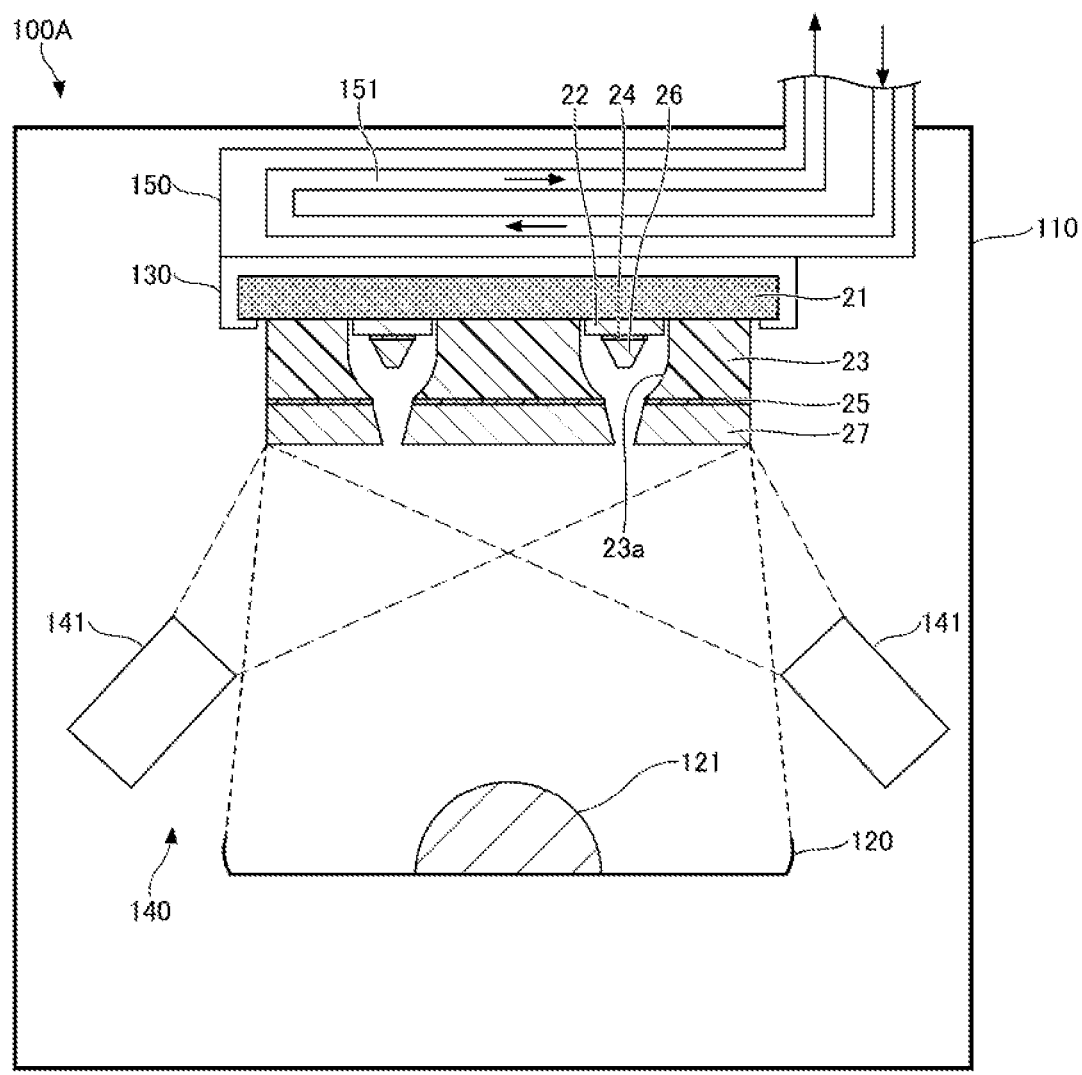
FIG. 17 is a diagram illustrating a vapor deposition apparatus of a first configuration example according to an embodiment of the present disclosure.

First, a vapor deposition apparatus 100A according to a first configuration example of the embodiment will be described with reference to FIG. 17. FIG. 17 is a diagram illustrating vapor deposition apparatus 100A according to the first configuration example of the embodiment.

Vapor deposition apparatus 100A is an apparatus for forming a thin Olin on a substrate held by a substrate-holding mechanism 130 by causing a current to flow through resistance-heating boat 120 provided in a chamber 110 to generate heat, and by heating and evaporating a film-forming source material contained in resistance-heating boat 120. That is, vapor deposition apparatus 100A is a vacuum vapor deposition apparatus using resistance-heating.

Vapor deposition apparatus 100A includes chamber 110, resistance-heating boat 120, substrate-holding mechanism 130, a heating mechanism 140, and a cooling mechanism 150.

Chamber 110 is configured such that the inside thereof can be depressurized by an exhaust device (not illustrated) such as a vacuum pump.

Resistance-heating boat 120 is disposed in a lower portion of chamber 110. Resistance-heating boat 120 holds film-forming source material 121. Film-forming source material 121 is, for example, indium. Resistance-heating boat 120 generates heat when a current flows from a current source (not shown), and heats and evaporates the film-forming source material.

Substrate-holding mechanism 130 is disposed above resistance-heating boat 120 in chamber 110. Substrate-holding mechanism 130 holds readout integrated circuit substrate 20 with readout integrated circuit substrate 20 placed such that the surface including photoresist film 23 faces downward. In plan view, the outer periphery of wiring substrate 21 may be positioned inside relative to the outer periphery of resistance-heating boat 120. Accordingly, all of the indium dropped by heating In-film 27 can be recovered in resistance-heating boat 120.

Heating mechanism 140 includes a plurality (two in FIG. 17) of heaters 141. However, the number of heaters 141 may be one. Each of heaters 141 is disposed so as to be positioned outside a space that is interposed between resistance-heating boat 120 and substrate-holding mechanism 130. Thus, heaters 141 do not interfere with vapor-depositing of the film-forming source material. In addition, the film-forming source material can be prevented from depositing on heaters 141. Heating mechanism 140 heats In-film 27 of readout integrated circuit substrate 20 held by substrate-holding mechanism 130 by radiant heat from heaters 141. Heating mechanism 140 is preferably disposed obliquely below substrate-holding mechanism 130. This prevents photoresist film 23 from being heated and efficiently heats In-film 27 deposited on metallic layered film 25. Therefore, it is easy to suppress burning of photoresist film 23. As heaters 141, infrared lamp heaters that heat a surface of an object by radiation of infrared rays may be used. Alternatively, heaters 141 may be devices that emit, toward the object, light (for example, visible light) having a wavelength other than the infrared region. Alternatively, heaters 141 may be light beam irradiation devices that irradiate an object with laser light to heat the object.

Cooling mechanism 150 is disposed above substrate-holding mechanism 130 in chamber 110. Cooling mechanism 150 includes a refrigerant channel 151. A refrigerant supplied from a chiller unit (not shown) flows through refrigerant channel 151 to cool substrate-holding mechanism 130 and wiring substrate 21 held by substrate-holding mechanism 130. The refrigerant is, for example, a liquid such as water or Galden, or a gas such as helium (He). When In-film 27 is heated, wiring substrate 21 is preferably cooled by cooling mechanism 150. Cooling wiring substrate 21 allows photoresist film 23 to be prevented from becoming too hot, so that photoresist film 23 is easily prevented from burning.

Figure 18:
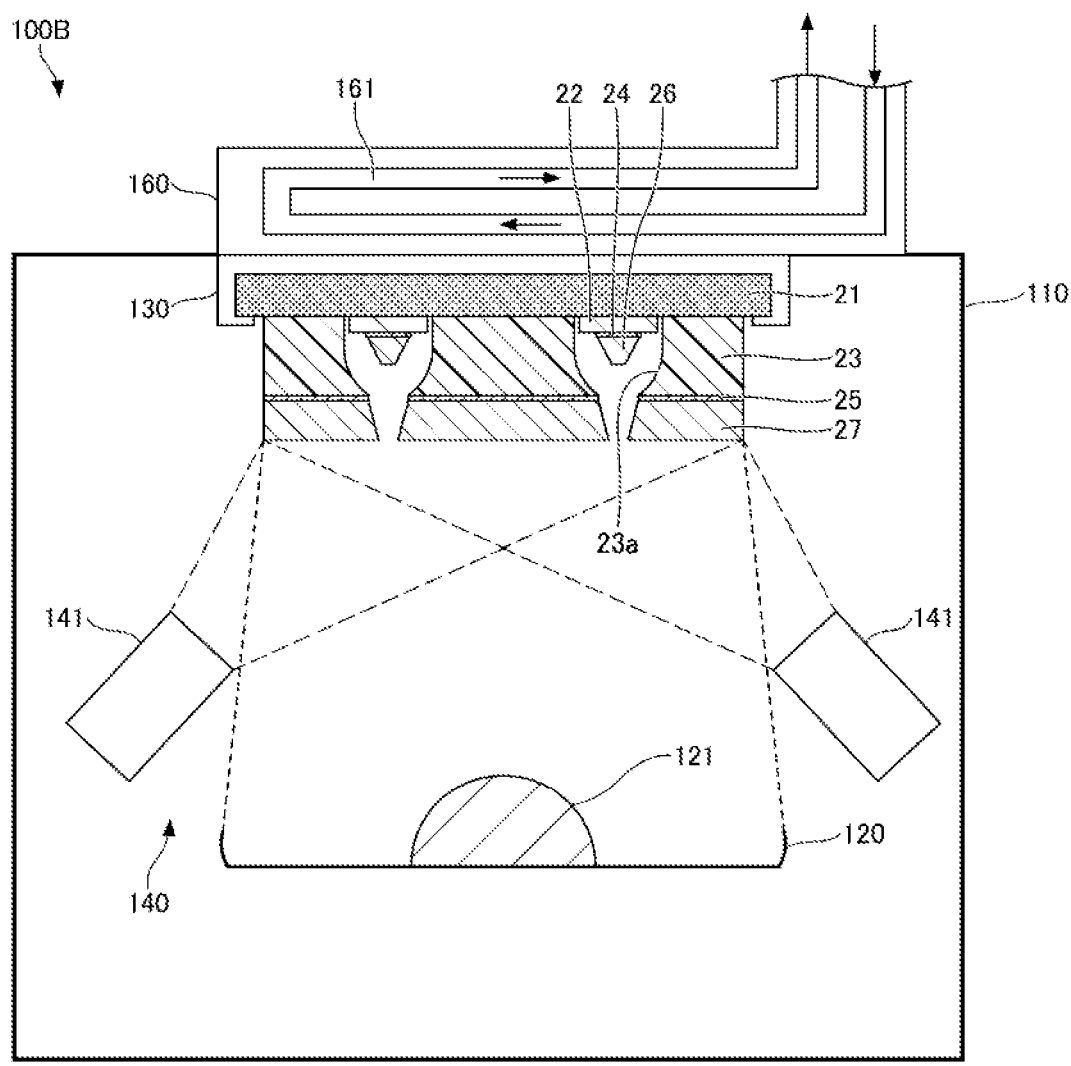
FIG. 18 is a diagram illustrating a vapor deposition apparatus of a second configuration example according to an embodiment of the present disclosure.

Next, a vapor deposition apparatus 100B according to a second configuration example of the embodiment will be described with reference to FIG. 18. FIG. 18 is a diagram illustrating vapor deposition apparatus 100B according to the second configuration example of the embodiment.

Vapor deposition apparatus 100B includes a cooling mechanism 160 instead of cooling mechanism 150. Cooling mechanism 160 is disposed outside chamber 110. Cooling mechanism 160, similarly to cooling mechanism 150, is disposed above substrate-holding mechanism 130. Cooling mechanism 160 includes a refrigerant channel 161. A refrigerant supplied from a chiller unit (not shown) flows through refrigerant channel 161 to cool substrate-holding mechanism 130 and wiring substrate 21 held by substrate-holding mechanism 130.

Figure 19:
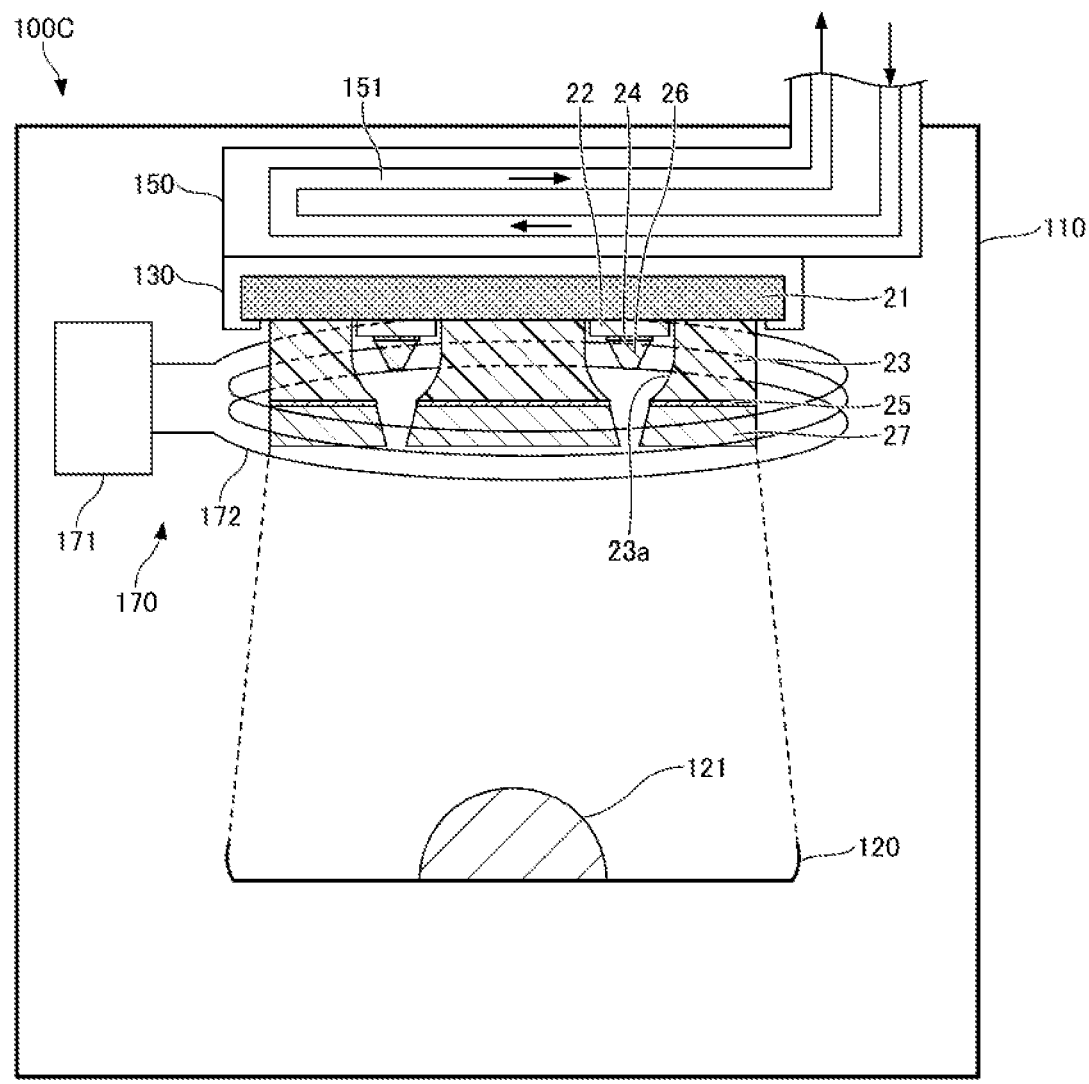
FIG. 19 is a diagram illustrating a vapor deposition apparatus of a third configuration example according to an embodiment of the present disclosure.

Next, a vapor deposition apparatus 100C according to a third configuration example of the embodiment will be described with reference to FIG. 19. FIG. 19 is a diagram illustrating vapor deposition apparatus 100C according to the third configuration example of the embodiment.

Vapor deposition apparatus 100C includes a heating mechanism 170 instead of heating mechanism 140. Heating mechanism 170 includes a power source 171 and a coil 172. Heating mechanism 170 heats In-film 27, which is a metal, by a magnetic field generated by supplying an alternating current from power source 171 to coil 172. That is, heating mechanism 170 heats In-film 27 by induction heating. In the induction heating, photoresist film 23 which is an insulator is not heated. Therefore, it is easy to suppress burning of photoresist film 23.

Figure 20:
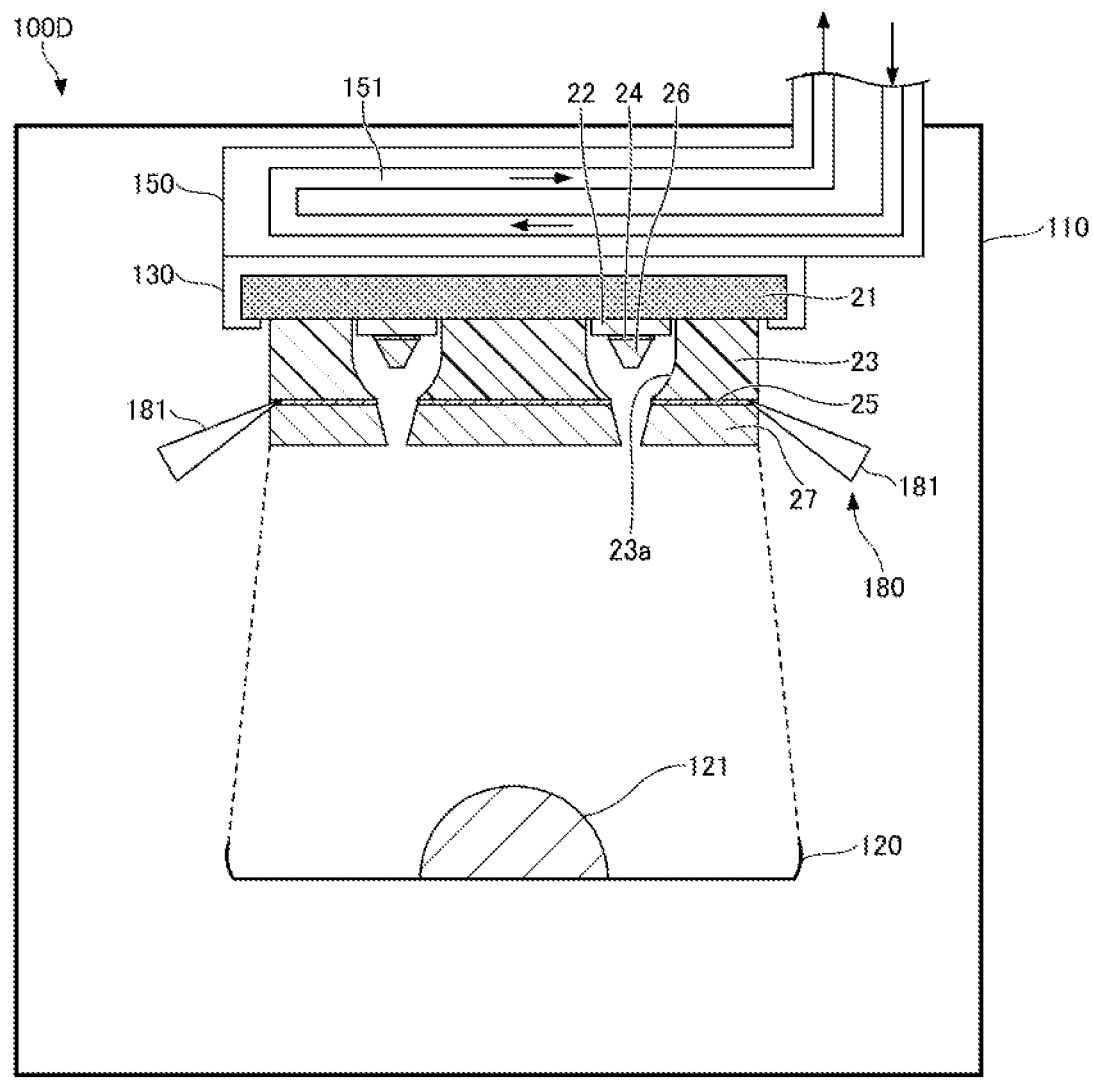
FIG. 20 is a diagram illustrating a vapor deposition apparatus of a fourth configuration example according to an embodiment of the present disclosure.

Next, a vapor deposition apparatus 100D according to a fourth configuration example of the embodiment will be described with reference to FIG. 20. FIG. 20 is a diagram illustrating vapor deposition apparatus 100D according to the fourth configuration example of the embodiment.

Vapor deposition apparatus 100D includes a heating mechanism 180 instead of heating mechanism 140. Heating mechanism 180 includes a plurality (two in FIG. 20) of heating members 181. However, the number of heating members 181 may be one. Heating members 181 may maintain a solid shape at a melting point of the film-forming source material or higher, and may be chemically non-reactive with the film-forming source material and the photoresist film. As heating members 181, metal heaters made of platinum or the like, or carbon heaters may be used. Alternatively, heating members 181 may be heaters made of ceramic such as silicon nitride (SiN), silica (SiO2), boron nitride (p-BN), alumina, or silicon carbide (SiC). Each of heating members 181 is disposed so as to be positioned outside a space that is interposed between resistance-heating boat 120 and substrate-holding mechanism 130. Thus, heating members 181 do not interfere with deposition of the film-forming source material. In addition, the film-forming source material can be prevented from being deposited on heating members 181. Heating mechanism 180 heats metallic layered film 25 and In-film 27 through heat conduction by bringing the tip end of each of heating members 181 into contact with metallic layered film 25. The tip ends of heating members 181 may be brought into contact with In-film 27.

Figure 21:
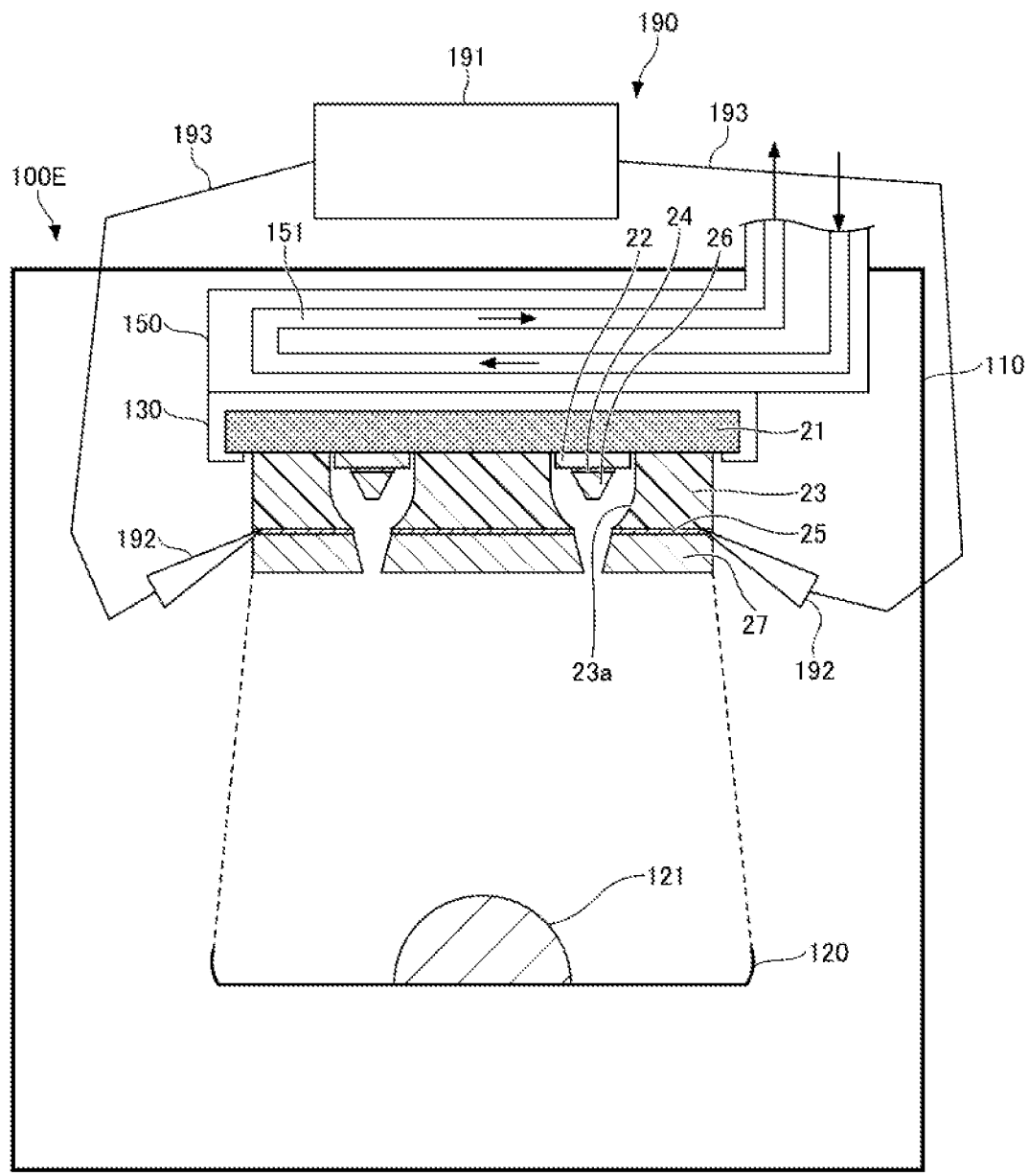
FIG. 21 is a diagram illustrating a vapor deposition apparatus of a fifth configuration example according to an embodiment of the present disclosure.

Next, a vapor deposition apparatus 100E according to a fifth configuration example of the embodiment will be described with reference to FIG. 21. FIG. 21 is a diagram illustrating vapor deposition apparatus 100E according to the fifth configuration example of the embodiment.

Vapor deposition apparatus 100E includes a heating mechanism 190 instead of heating mechanism 140. Heating mechanism 190 includes a power source 191, a wiring 193, and a plurality (two in FIG. 21) of probes 192. However, the number of probes 193 may be one. Each of probes 192 is disposed so as to be positioned outside a space that is interposed between resistance-heating boat 120 and substrate-holding mechanism 130. Thus, probes 192 do not interfere with deposition of the film-forming source material. In addition, deposition of the film-forming source material on probes 192 can be suppressed. Heating mechanism 190 heats metallic layered film 25 and In-film 27 by causing a current to flow from power source 191 to metallic layered film 25 and In-film 27 through wiring 193 and probes 192 with the tip ends of probes 192 in contact with metallic layered film 25. That is, heating mechanism 190 heats In-film 27 by Joule heat. The tip ends of probes 192 may be brought into contact with In-film 27.

Although the embodiments have been described above in detail, the present disclosure is not limited to the specific embodiments, and various modifications and changes can be made within the scope described in the claims.

In the above-described embodiments, the metal constituting the bump is indium, but the present disclosure is not limited thereto. For example, the metal constituting the bump may be gallium (Ga), mercury (Hg), cesium (Cs), or an alloy containing indium (In), bismuth (Bi), and tin (Sn). When the bump contains indium, it is easy to connect the bump to the metallic layered film of the readout integrated circuit substrate. Since Ga, Hg, Cs, and the alloy containing, In, Bi, and Sn has a melting point lower than that of indium, these metals are turned into droplets at a temperature lower than the temperature at which indium is turned into droplets. Therefore, it is easy to suppress burning of the photoresist film.

In the above-described embodiments, the In-bump is formed on the readout integrated circuit substrate has been described, but the present disclosure is not limited thereto. For example, the In-bump may be formed on a light-receiving element, or the In-bump may be formed on both the readout integrated circuit substrate and the light-receiving element.

In the above embodiments, the vapor deposition apparatus is a resistance-heating vacuum vapor deposition apparatus, but the present disclosure is not limited thereto. For example, the vapor deposition apparatus may be a vacuum vapor deposition apparatus using electron beam heating or a vacuum vapor deposition apparatus using high-frequency induction heating.

What is claimed is:

1. A method of manufacturing a photodetection device, the method comprising:
   preparing a first substrate including a first electrode;
   forming, on the first substrate, a photoresist film having an opening through which the first electrode is exposed;
   forming, through the opening, a metallic film containing a first metal on the first electrode; and
   removing, after the forming of the metallic film, the photoresist film,
   wherein the forming of the metallic film includes
   on the first electrode and on the photoresist film, vapor-depositing the metallic film, and
   heating the metallic film formed on the photoresist film.

2. The method of manufacturing a photodetection device according to claim 1,
   wherein the heating of the metallic film includes heating the metallic film at a melting point of the first metal or higher.

3. The method of manufacturing a photodetection device according to claim 1, wherein the heating of the metallic film includes cooling the first substrate.

4. The method of manufacturing a photodetection device according to claim 1,
wherein the heating of the metallic film includes heating with the first substrate placed such that a surface including the photoresist film faces downward.

5. The method of manufacturing a photodetection device according to claim 4,
wherein the vapor-depositing, of the metallic film includes, with the first substrate placed such that the surface including the photoresist film faces downward, heating the first metal placed in a container disposed below the first substrate, and
the heating of the metallic film includes heating performed above the container.

6. The method of manufacturing a photodetection device according to claim 5,
wherein, in plan view, an outer periphery of the first substrate is positioned inside relative to an outer periphery of the container.

7. The method of manufacturing a photodetection device according to claim 1,
wherein the vapor-depositing of the metallic film and the heating of the metallic film are repeated.

8. The method of manufacturing a photodetection device according to claim 1,
wherein the first metal is indium.

9. The method of manufacturing a photodetection device according to claim 1, the method further comprising:
preparing a second substrate including a second electrode; and
placing a first main surface including the first electrode of the first substrate and a second main surface including the second electrode of the second substrate so as to face each other and bonding together the metallic film and the second electrode.

10. The method of manufacturing a photodetection device according to claim 9,
wherein the first substrate is a circuit substrate, and the second substrate is a light-receiving element.

* * * * *